United States Patent
Lopatin et al.

(10) Patent No.: US 6,437,989 B1
(45) Date of Patent: Aug. 20, 2002

(54) CIRCUIT BOARD WITH AN ELECTRONIC COMPONENT AND A METHOD FOR PRODUCING A CONNECTION BETWEEN THE CIRCUIT BOARD AND THE COMPONENT

(75) Inventors: Sergej Lopatin, Lörrach; Dietmar Birgel, Schopfheim, both of (DE); Karl-Peter Hauptvogel, Bartenheim (FR)

(73) Assignee: Endress + Hauser GmbH + Co., Maulburg (DE)

( * ) Notice: Subject to any disclaimer, the term of this patent is extended or adjusted under 35 U.S.C. 154(b) by 0 days.

(21) Appl. No.: 09/577,913

(22) Filed: May 24, 2000

Related U.S. Application Data
(60) Provisional application No. 60/147,369, filed on Aug. 5, 1999.

(30) Foreign Application Priority Data

Jul. 10, 1999 (EP) .............................. 99113394

(51) Int. Cl.⁷ ................................. H05K 7/10
(52) U.S. Cl. ................ 361/760; 361/767; 361/779; 361/743; 361/745; 361/749; 257/779; 257/766; 257/782; 174/262; 174/263; 29/837; 29/852
(58) Field of Search ..................... 361/760, 761, 361/767, 772, 779, 813, 719, 715, 736, 743, 745, 749; 257/737, 738, 762, 766, 779, 782, 784; 174/263, 262; 29/837, 852

(56) References Cited

U.S. PATENT DOCUMENTS 4,982,376 A * 1/1991 Megens et al. ............. 361/400
5,487,211 A    1/1996 Haas et al.
5,639,010 A    6/1997 Todd et al.
5,641,995 A    6/1997 Sloma et al.
5,874,043 A *  2/1999 Sarkhel ....................... 420/557
6,005,330 A * 12/1999 Okeshi et al. .............. 310/348
6,153,940 A * 11/2000 Zakel et al. ................ 257/779
6,191,485 B1 * 2/2001 Kawashima et al. ........ 257/766

FOREIGN PATENT DOCUMENTS

EP    55110415     8/1980
EP    62207009     9/1987
EP    03263360    11/1991

OTHER PUBLICATIONS

Vincent, J.H., and Humpston, G., "Lead–Free Solders for Electronic Assembly", 645 *The GEC Journal of Research*, 11 (1994) No. 2, Chelmsford, Essex, GB, vol. II, No. 2, 1994, 14 pages.

* cited by examiner

*Primary Examiner*—David S. Martin
*Assistant Examiner*—Hung Bui
(74) *Attorney, Agent, or Firm*—Bose McKinney & Evans LLP

(57) ABSTRACT

This circuit board contains electronic components having electrical contacts. At least one of the electrical contacts is initially glued to the circuit board using a conductive adhesive and at least one of the electrical contacts is connected to the circuit board by soldering. The circuit board is suitable for fast mechanical mass production. Further a method for the manufacture of the connection between the circuit board and the electronic components is disclosed, in which a solder is applied to soldering points and a conductive adhesive is applied to adhesive points. The circuit board with the components is then placed in a furnace to connect the components to the circuit board.

10 Claims, 1 Drawing Sheet

CIRCUIT BOARD WITH AN ELECTRONIC COMPONENT AND A METHOD FOR PRODUCING A CONNECTION BETWEEN THE CIRCUIT BOARD AND THE COMPONENT

This application claims priority from provisional application No. 60/147,369, filed Aug. 15, 1999.

FIELD OF THE INVENTION

This invention relates to a circuit board with at least one electronic component and a method for producing a connection between the circuit board and each component. The connection provides the mechanical fastening of the component onto the circuit board as well as the electrical connection of the component to the circuit board.

BACKGROUND OF THE INVENTION

Modern electrical appliances, especially measuring instruments, normally have at least one circuit board containing electronic components. These components must be mounted onto the circuit board mechanically and must be electrically connected to wires running to, in or on the circuit board. In order to reduce production costs, surface mountable components, so-called "Surface Mounted Devices," in short "SMD" components, are preferably used. SMD components require no circuit board holes for their assembly, rather their contacts are soldered directly onto pads provided on the circuit board. SMD components can be placed on the circuit board mechanically using fitting machines.

Typically in a first step of the manufacturing process for connecting components to a circuit board, soldering paste is applied to the circuit board in all places where components are later to be placed using a screen printing process. Any place where solder has been applied or where a soldering connection exists after the completion of this initial step is called a soldering point.

In the next step, the components are mechanically placed on the circuit board. The circuit board with the components is placed in a furnace. The soldering process is carried out in the furnace, for instance in a controlled protective inert-gas atmosphere, which cycles through a solder-specific temperature cycle.

Alternatively the application of solder to the circuit board and the soldering process can also be carried out using a soldering bath. Since the soldering points are located in between the circuit board and the components, the circuit board must be placed in the soldering bath in such a way that the components project into the bath. In order for the components not to fall into the bath, they are fixed to the circuit board with adhesive before they are placed in the soldering bath. The type of adhesive used, usually a liquid tin alloy, must be able to withstand the temperature of the soldering bath. Such adhesives are commercially available. In order for the adhesive to adhere, it first has to harden after being placed on the circuit board. For this purpose, the adhesives usually have to be heated. Thus, an additional step is required before the soldering process can be carried out, specifically the gluing on of the components to the circuit board. In this case, the adhesive serves exclusively for the mechanical fastening of the components.

Many appliances, such as measuring instruments for measuring pressure, temperature, fluid levels, pressure or flow, are used under conditions in which very high temperatures can occur. Such applications include, for example, the chemistry industry and the food industry. Temperatures of more than 100° C. can be used in the food industry during the cleaning and sterilization processes.

One example of a measuring instrument is a fluid level limit switch. Fluid level limit switches are commercially available, and are used to detect when a fluid limit has been reached, as protection against overflow, or as protection against running a pump dry. These limit switches may include a mechanical vibrating structure extending into a receptacle. The mechanical structure is caused to vibrate by means of a piezoelectric element. The resonance frequency and/or the amplitude of the stimulated vibration is measured. Using this information it is determined whether the vibrating structure is vibrating freely or whether it is covered by a fluid material. A fluid level limit switch is described in U.S. patent appl. Ser. No. 09/388,299 filed on Sep. 1, 1999, in which the vibrating structure extending into the receptacle has two vibrating rods which are connected to a membrane. A piezoelectric element is mounted on the side of the membrane facing away from the vibrating rods. The piezoelectric element may, for example, be glued on the membrane. The vibrating rods are excited into vibration through the membrane by the piezoelectric element.

On the side of the membrane facing away from the vibrating rods, the piezoelectric element is electrically and mechanically connected to a flexible circuit board. This circuit board contains electronic components, preferably SMD components, in addition to the piezoelectric element. These SMD components are for instance elements restricting electricity and voltage, or parts of a signal receiver and/or signal processing circuit. Until now the circuit board was first equipped with SMD components in the manufacturing process, the SMD components were soldered, and then the piezoelectric element was connected.

In addition to the aforementioned example, there are a great number of further applications in which other electronic components besides SMD components must be placed on the same circuit board. In these applications it is desirable to mechanically connect all components, preferably in one process, and to connect these components electrically and mechanically with the circuit board in a mass production process.

Soldered connections are only stable at low temperatures, for instance temperatures that lie far below 150° C. At temperatures above a solder-specific maximum level, the solder becomes soft and the mechanical and electrical connection is no longer guaranteed. When using piezoelectric elements, this problem becomes evident at lower temperatures as compared to conventional SMD components. This is due to the mechanical vibrations of the piezoelectric element, since the connection is exposed to mechanical stress.

There are adhesives available on the market which make possible connections that still guarantee reliable mechanical connections at higher temperatures, for instance at temperatures of about 150° C. Some of these commercially available adhesives are electrically conductive, so that there is also an electric connection when they are used.

These adhesives are normally very watery and must set at the desired gluing point before they initially become sticky, and then finally completely harden, and adhere. These adhesives are therefore not suitable for fast mass production. Transportation and/or the processing of an assembly unit consisting of a circuit board and at least one electric component is not possible until the adhesive has hardened enough for it to at least become sticky.

One objective of the present invention is to provide a circuit board with at least one electric component, and to provide a method for the manufacture of a connection between the circuit board and the component so that fast mechanical mass production is possible and the circuit board can still be used at higher temperatures.

SUMMARY OF THE INVENTION

The invention includes a circuit board containing at least one electronic component. The component has at least two electrical contacts, of which the first is initially glued to the circuit board using a conductive adhesive and the second of which is connected to the circuit board by soldering using a solder.

In accordance with one embodiment of the present invention, at least one component is a piezoelectric element.

In accordance with another embodiment of the present invention, the solder is free from lead and contains, in part, silver.

In accordance with another embodiment, the solder is a tin-silver solder.

In accordance with another embodiment, the circuit board is a flexible circuit board, especially one made from polyimide.

In accordance with another embodiment, the two contacts are connected to copper plates on the circuit board.

In accordance with another embodiment, the copper plates contain a nickel/gold connecting metal plating or a layer of tin.

Furthermore, the invention comprises a method for the manufacture of a connection between a circuit board and at least one electronic component, in which:

- solder is applied to soldering points and a conductive adhesive is applied to adhesive points, spatially separated from each other, on each surface of the circuit board where a component is to be placed,
- the components are placed on the appropriate surfaces,
- the circuit board with the components is placed in a furnace and
- the furnace is cycled through a temperature cycle, which results in a solder connection between the component part and the circuit board, and through which the adhesive develops its adhesive effect.

According to a further feature of the method, the components are SMD components or components on which all contacts to be connected to a circuit board are in one plane on one side of the component and which form flat surfaces. The components are placed on the circuit board mechanically.

According to one embodiment of the method, the solder is applied mechanically using a screen printing process and the adhesive is applied using a dispenser.

BRIEF DESCRIPTION OF THE DRAWINGS

The invention and further advantages are now explained in more detail with reference to the figures in which two embodiments of the present invention are shown. In these figures, the same elements have the same reference numbers.

Figure 1:
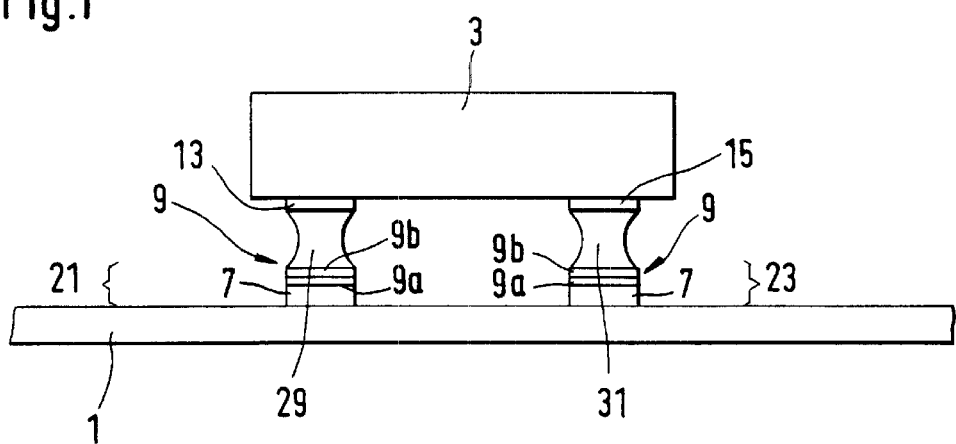
FIG. 1 shows a diagram of a circuit board with an SMD component.

While the invention is susceptible to various modifications and alternative forms, exemplary embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Figure 2:
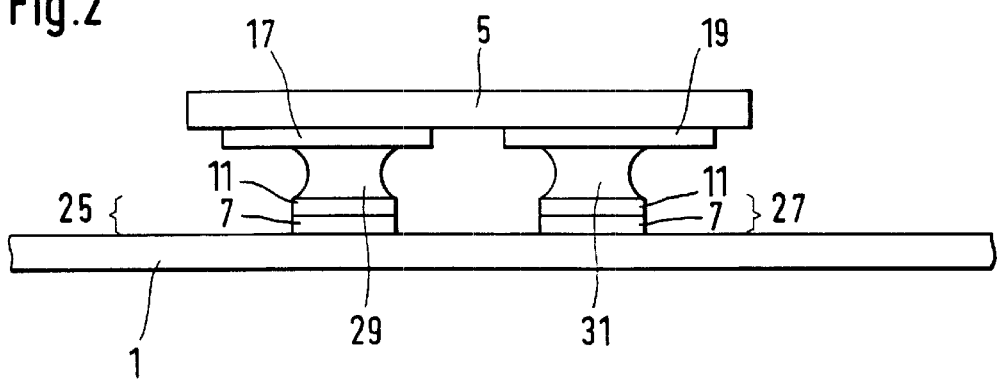
FIG. 2 shows a diagram of a circuit board with a piezoelectric element.

FIGS. 1 and 2 each show a circuit board 1 with an electronic component. In the example shown in FIG. 1, the component 3 is a conventional SMD component and in the example shown in FIG. 2 the component part is a piezoelectric element 5.

The circuit board 1 can be a commercially available stiff circuit board, for instance one made from insulation with an epoxide resin as a base, or a flexible circuit board, for instance made from polyimide. Strip conductors on the circuit board usually consist of copper and have copper plates 7 where a connection is to be made.

There can be a connecting metal plating 9 on the copper plate 7 as shown in FIG. 1. The connecting metal plating 9 could be, for example, a nickel layer 9a and a gold layer 9b. The nickel is applied using the known galvanic method and the gold is applied chemically. In this embodiment, the nickel layer 9a is disposed between the copper plate 7 and the gold layer 9b. The nickel layer in this embodiment serves as a diffusion barrier and prevents the migration of the copper into the gold layer 9b. This type of surface improvement is frequently used in soldering connections. Since the gold layer 9b has a very smooth and even surface, it is also very well suited for gluing.

As an alternative, the soldering can be improved through hot air tin plating, as shown in FIG. 2. In this case, the tin is applied to the surface of the copper plate 7 in an immersion bath and is blown off by means of hot air. The liquid tin forms a tin layer 11 having a very flat surface which is advantageous for the soldering process that follows. The process is also known as Hot Air Leveling (HAL). In this case as well, the flat surface is advantageous for gluing.

Both types of surface preparation, i.e., the connecting metal plating and the hot air tin plating, are therefore well suited for soldering and gluing. For this reason the soldering and adhesive points can be simultaneously processed. A differentiation between the two, which would mean additional expenses in production engineering, is not necessary.

In accordance with the present invention, each component has at least two electric contacts. The SMD component 3 displayed in FIG. 1 has a first and a second contact 13, 15. The contacts of commercially available SMD components consist of a tin-lead alloy.

The piezoelectric element 5 shown in FIG. 2 also has a first and second contact 17, 19. These contacts are electrodes applied to the element. Two separate electrodes are shown here. However a single electrode can have contacts at several positions, which means one electrode can correspond to several contacts. The electrode preferably consists of silver.

The circuit board 1 shown in FIGS. 1 and 2 also each have a first and second connection 21, 23, and 25, 27, respectively. The implementation of the embodiment illustrated in FIG. 1 shows the first and the second connections 21, 23, each of which consists of a copper plate 7 and an applied connecting metal plating 9. The implementation of the embodiment illustrated in FIG. 2 shows the first and the second connections 25, 27, each of which consists of a copper plate 7 and the tin layer 11.

In accordance with the present invention, in the embodiment shown in FIGS. 1 and 2, the first contact 13, 17 are connected to the corresponding first connections 21, 25 on the circuit board 1 by gluing 29 then with a conductive adhesive 29 and the second contacts 15, 19 and connected to the corresponding second connections 23, 27 on the circuit board 1 with solder 31.

In the case of the SMD component in FIG. 1, the solder and adhesive touch the contacts 13, 15 which consist of tin-lead, and in the case of the piezoelectric element 5 in FIG. 2, the solder and adhesive touch the contacts 17, 19, which consist of silver.

On a circuit board containing several components with contacts made up of various materials, it is preferable that one single solder and one single adhesive be used, which work well together with the different materials.

On a circuit board which, for example, consists of one or more SMD components and one or more piezoelectric elements, which are set up side by side as shown in FIGS. 1 and 2, a solder and an adhesive are preferably used, each of which work well with silver as well as with a tin-lead alloy. A particularly suitable solder is one that contains, in part, silver. Very good results are achieved using a tin-silver solder. The conductive adhesive also should preferably contain, in part, silver. For instance, the adhesive Amicon CE 3511 produced by Grace Emerson Cuming can be used. The silver part in the solder and adhesives prevents the silver in the electrodes of the piezoelectric element from leaking into the solder and the adhesive. The silver part therefore protects the connection between the silver electrodes and the piezoelectric elements.

The solder should preferably be free from lead. Lead has a low melting point and as a result, stable connections can only be made using ferrous solder at low temperatures. A tin-lead solder has a melting point of approximately 180° C. And a tin-silver solder has a melting point of approximately 220° C.

The connection between the circuit board and at least one electronic component shown in the two embodiments in FIGS. 1 and 2 is produced in accordance with the present invention, in which solder is applied to the soldering points and adhesive is applied to adhesive points, spatially separate from each other, on each surface of the circuit board where a component is to be applied. The solder is preferably applied mechanically using a screen printing process and the adhesive is applied using a dispenser.

In the next step, the components are positioned onto the corresponding surfaces. The components used are preferably SMD components or components which have similar characteristics for connection to a circuit board. If all the components have similar connection characteristics, they the can be positioned onto the circuit board mechanically in the same process. A machine for positioning components on a circuit board should be used for this procedure.

A component can be handled as an SMD component if all contacts that are to be connected to a circuit board are arranged in one plane on one side of a component and form flat surfaces.

It is possible to treat a piezoelectric element like an SMD component in a production process. Thus, the mechanical application and the connection of the circuit board with SMD components and piezoelectric elements can take place in mass production.

Because of the wet adhesion properties of the solder, all components are fixed onto the circuit board and, thereafter, the circuit board can immediately be transported. This makes it possible to transport the circuit boards during the entire manufacturing process over conveyer belts. Vibrations, as they inevitably occur during this mode of transport, do not lead to a shifting or even a loss of components. Further processing steps can be carried out immediately, if necessary.

After this step, the circuit board with the components is placed in a furnace. Because the wet adhesion properties of the solder, this can take place directly following the positioning and fixing of the components onto the circuit board via a conveyer belt. The furnace is cycled through a temperature cycle, which causes an electrical and mechanical solder and adhesive connection between each component and the circuit board. Because of the heating, the solder melts and the adhesive hardens. Accordingly, the adhesive and soldering connections are carried out simultaneously in a single operation.

The temperatures occurring in this process are not a disadvantage for piezoelectric elements, but in fact are advantageous. Provided the piezoelectric elements are only connected to the circuit board in the described manner and are not mechanically tightly fastened, no noticeable depolarization of piezoelectric elements occurs at the temperatures necessary for the gluing and soldering process. However, there are sediment effects, which cause an artificial aging of the piezoelectric elements. Signs of aging or slackening can therefore be found immediately following the manufacturing process. However, these effects can be taken into consideration through an adjustment of the circuit in which such a piezoelectric element is contained or with the initial calibration of an appliance in which the circuit board is placed.

The remaining free surfaces of the piezoelectric elements are cleansed using heat. This can be an advantage, for example, when such a piezoelectric element is to be adhered to the circuit board on site. Adhesives can adhere better on clean surfaces.

Tests have shown that the described connection produces outstanding results in terms of its electric and mechanical characteristics. Circuit boards with interconnected components were exposed to cycles of extreme temperature changes. The transitional resistance of the connections was recorded to test the electrical characteristics, and tearing and peeling tests were carried out to test the mechanical characteristics.

The tearing strength of the adhesive connections is clearly greater than that of the soldered connections. On the other hand, the soldered connections have a higher solidity than the adhesive connections when they are stressed for peeling, i.e., when normal stress is added. The connection between the components and circuit boards is therefore resistant to both types of mechanical stress. However, at higher temperatures, the strength of the adhesive connections in terms of mechanical stress capacity increases with respect to the soldered connections.

Since the soldering connection protects the adhesive connection depending on the different mechanical stresses and vice versa, this connection clearly holds longer than the conventional connections described in the prior art.

The measurement of resistance showed that there was no discernible stress related damage to the soldered and adhesive connections. This is at least in part attributable to the high mechanical stress capacity of the connection.

While the invention has been illustrated and described in detail in the drawing and foregoing description, such illustration and description is to be considered as exemplary and not restrictive in character, it being understood that only exemplary embodiments have been shown and described and that all changes and modifications that come within the spirit of the invention are desired to be protected.

What we claim is:

1. A method for the manufacture of a connection between a circuit board and at least one electronic component, in which:
    solder is applied to soldering points and a conductive adhesive is applied to adhesive points, spatially separated from each other, on each surface of the circuit board where a component is to be placed,
    the components are placed on the appropriate surfaces,
    the circuit board with the components is placed in a furnace and
    the furnace is cycled through a temperature cycle, which results in a solder connection between the component part and the circuit board, and through which the adhesive develops its adhesive effect.

2. A circuit board containing at least one electronic component having at least two electrical contacts, said at least two electrical contacts being connected to the circuit board by the method of claim 1.

3. A circuit board as claimed in claim 2, wherein at least one component is a piezoelectric element.

4. A circuit board as claimed in claim 2, wherein the circuit board is a flexible circuit board, especially one made from a polyimide.

5. A circuit board as claimed in claim 2, wherein the solder is free from lead and contains, in part, silver.

6. A circuit board as claimed in claim 5, wherein the solder is a tin-silver solder.

7. A circuit board as claimed in claim 4 wherein the first of the two contacts is glued to a first copper plate on the circuit board and wherein the second of the two contacts is soldered to a second copper plate on the circuit board.

8. A circuit board as claimed in claim 7, wherein the first and the second copper plate contain a nickel/gold connecting metal plating or a layer of tin.

9. A method as claimed in claim 8 wherein the components are SMD components or components on which all contacts to be connected to a circuit board are in one plane on one side of the component and which form flat surfaces, and wherein the components are placed on the circuit board mechanically.

10. A method as claimed in claim 8, wherein the solder is applied mechanically using a screen printing process and the adhesive is applied using a dispenser.

* * * * *